(12) United States Patent
Franken et al.

(10) Patent No.: US 7,889,312 B2
(45) Date of Patent: Feb. 15, 2011

(54) APPARATUS COMPRISING A ROTATING CONTAMINANT TRAP

(75) Inventors: Johannes Christiaan Leonardus Franken, Knegsel (NL); Vadim Yevgenyevich Banine, Helmond (NL); Arnoud Cornelis Wassink, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1181 days.

(21) Appl. No.: 11/525,225

(22) Filed: Sep. 22, 2006

(65) Prior Publication Data

US 2010/0259733 A1    Oct. 14, 2010

(51) Int. Cl.
*G03B 27/52*    (2006.01)
*G03B 27/54*    (2006.01)
*G03B 27/72*    (2006.01)

(52) U.S. Cl. .............................. 355/30; 355/67; 355/71

(58) Field of Classification Search .................... 355/30, 355/53, 67, 71
See application file for complete search history.

(56) References Cited

U.S. PATENT DOCUMENTS 6,018,442 A    1/2000    Verbunt et al.

| 2004/0099820 | A1 | 5/2004 | Bristol |
| 2004/0135985 | A1 | 7/2004 | Bakker et al. |
| 2006/0061740 | A1 | 3/2006 | Bakker et al. |
| 2007/0001126 | A1 | 1/2007 | Gayazov et al. |

FOREIGN PATENT DOCUMENTS

| DE | 102 37 901 B3 | 5/2004 |
| EP | 0 936 368 A2 | 8/1999 |
| EP | 1 274 287 B1 | 1/2005 |
| WO | 2007/114695 A1 | 10/2007 |

OTHER PUBLICATIONS

International Search Report for International Application No. PCT/NL2007/050451 dated Apr. 7, 2008.

*Primary Examiner*—Peter B Kim
(74) *Attorney, Agent, or Firm*—Pillsbury Winthrop Shaw Pittman LLP

(57) ABSTRACT

A contaminant trap apparatus arranged in a path of a radiation beam to trap contaminants emanating from a radiation source configured to produce the radiation beam is disclosed. The contaminant trap apparatus includes a rotor having a plurality of channel forming elements defining channels which are arranged substantially parallel to the direction of propagation of the radiation beam, the rotor including electrically chargeable material and arranged to be electrically charged as a result of the operation of the radiation source; and a bearing configured to rotatably hold the rotor with respect to a rotor carrying structure, wherein the apparatus is configured to (i) control or redirect an electrical discharge of the rotor, or (ii) suppress an electrical discharge of the rotor, or (iii) both (i) and (ii).

20 Claims, 7 Drawing Sheets

US 7,889,312 B2

APPARATUS COMPRISING A ROTATING CONTAMINANT TRAP

FIELD

The present invention relates to an apparatus comprising a rotatable contaminant trap.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An apparatus, comprising a debris mitigation system may be provided with a rotatable structure (called a rotating contaminant trap) to capture debris, emanating from an EUV (extreme ultraviolet) radiation source. For example, the source can emit micron-sized or smaller particles, which are unwanted downstream in the lithographic apparatus since the debris could seriously impair or contaminate optical components of the apparatus.

For example, the rotating contaminant trap can be provided with a driving mechanism to rotate the trap, and plates of the trap can have a rotational symmetry with respect to the rotation axis of the trap. It is desirable to rotate the trap with a generally high speed at which contaminant particles can be trapped efficiently, wherein the rotating contaminant trap can achieve long operational periods without requiring much maintenance.

SUMMARY

Embodiments of the invention include an apparatus comprising an improved debris mitigation system.

According to an embodiment, there is provided a contaminant trap apparatus arranged in a path of a radiation beam to trap contaminants emanating from a radiation source configured to produce the radiation beam, the contaminant trap apparatus comprising:

a rotor having a plurality of channel forming elements defining channels which are arranged substantially parallel to the direction of propagation of the radiation beam, the rotor comprising electrically chargeable material and arranged to be electrically charged as a result of the operation of the radiation source; and a bearing configured to rotatably hold the rotor with respect to a rotor carrying structure, wherein the apparatus is configured to (i) control or redirect an electrical discharge of the rotor, or (ii) suppress an electrical discharge of the rotor, or (iii) both (i) and (ii).

According to an embodiment, there is provided a lithographic apparatus, comprising:

a contaminant trap apparatus arranged in a path of a radiation beam to trap contaminants emanating from a radiation source configured to produce the radiation beam, the contaminant trap apparatus comprising:

a rotor having a plurality of channel forming elements defining channels which are arranged substantially parallel to the direction of propagation of the radiation beam, the rotor comprising electrically chargeable material and arranged to be electrically charged as a result of the operation of the radiation source; and a bearing configured to rotatably hold the rotor with respect to a rotor carrying structure, wherein the contaminant trap apparatus is configured to (i) control or redirect an electrical discharge of the rotor, or (ii) suppress an electrical discharge of the rotor, or (iii) both (i) and (ii);

a substrate table configured to hold a substrate; and a projection system configured to project the radiation beam as patterned onto the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
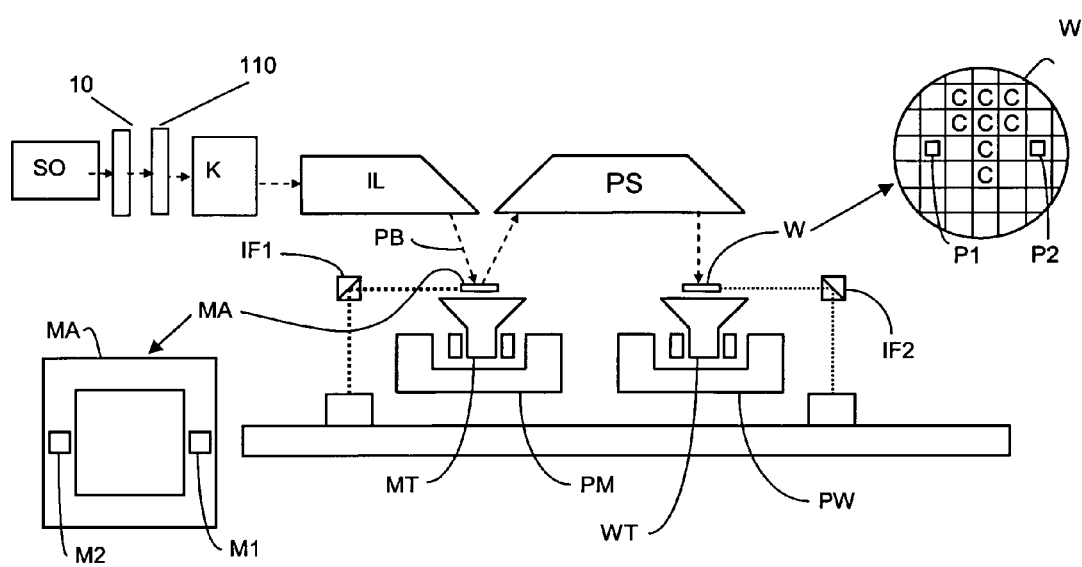
FIG. 1 depicts an embodiment of a lithographic apparatus.

FIG. 1 schematically depicts a lithographic apparatus according to one embodiment of the invention. The apparatus comprises a number of optical components, configured to condition a radiation beam PB, to impart the conditioned radiation beam with a pattern in its cross-section to form a patterned radiation beam, and to project the patterned radiation beam onto a target portion of a substrate W. In FIG. 1, the apparatus can comprise:

an illumination system (illuminator) IL configured to condition a radiation beam PB (e.g. UV radiation or other types of radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system PS configured to project a pattern imparted to the radiation beam PB by the patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables (and/or support structures) may be used in parallel, or preparatory steps may be carried out on one or more tables (and/or support structures) while one or more other tables (and/or support structures) are being used for exposure.

Referring to FIG. 1, the illuminator IL receives a radiation beam from a radiation source SO. The source SO and the illuminator IL, together with a beam delivery system if required, may be referred to as a radiation system. In an embodiment, the radiation source SO is a plasma EUV source, particularly a discharge plasma source, for example a tin (Sn) plasma EUV source. For example, in such a radiation source, Sn atoms can be heated (e.g., electrically) using a low power laser. The EUV radiation source can also be a different radiation source, for example a Li or Xe 'fueled' plasma radiation source. Also, during use, plasma electrons, charged particles and other debris particles may escape from the source SO, towards a collector K and the illuminator IL. The collector K can collect radiation from the radiation source SO. The collector K can be arranged to transmit the collected radiation to the illumination system IL. Particularly, the collector K can be arranged to focus incoming radiation, received from the radiation source, onto a small focusing area or focusing point.

A debris mitigation system 10, 110 is desirably provided to capture particles emanating from the source SO. As is depicted in FIG. 1, the mitigation system can be provided with one or more rotatable contaminant traps 10 (only one is shown), located near the source SO. Also, there can be provided one or more further contaminant traps 110, for example a static contaminant trap 110 that is positioned between the rotatable trap 10 and the radiation collector K. One or more embodiments of a rotatable trap system 10 are described below.

The illuminator IL may comprise an adjuster to adjust the angular intensity distribution of the radiation beam. Generally, at least the outer and/or inner radial extent (commonly referred to as $\sigma$-outer and $\sigma$-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam PB is incident on the patterning device (e.g., mask) MA, which is held on the support structure (e.g., mask table) MT, and is patterned by the patterning device. After traversing the patterning device MA, the radiation beam PB passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam PB. Similarly, the first positioner PM and another position sensor IF1 can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at once (i.e. a single static exposure). The substrate table WT is then shifted in the X and/or Y directions so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
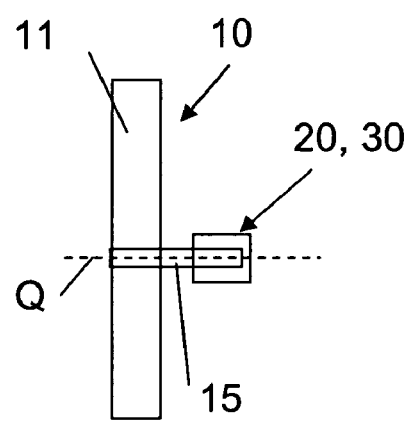
FIG. 2A schematically depicts an embodiment of rotatable contaminant trap, in side view.
Figure 2B:
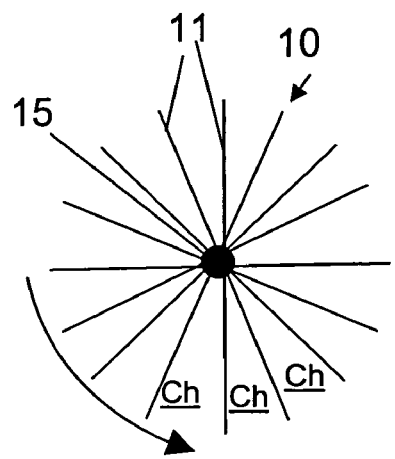
FIG. 2B schematically depicts a front view of an embodiment of the contaminant trap.
Figure 2C:
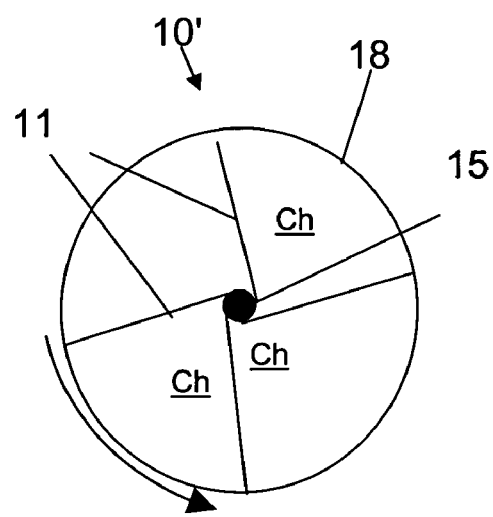
FIG. 2C schematically depicts a front view of an another embodiment of the contaminant trap.

FIGS. 2A-2C depict embodiments of a rotatable contaminant trap 10, 10'. For example, each trap 10, 10' can be a motor driven fan. As is depicted in FIGS. 2A-2B, the rotatable trap 10 may comprise a rotor 10 having a plurality of channel forming elements 11 defining channels Ch which may be arranged substantially parallel to a general direction of propagation of the radiation (i.e. a diverging radiation beam emanating from the source SO). More particularly, the rotatable trap 10 may permit transmission of radiation emanating from a radiation emission area LEP (see FIG. 3) of the source SO towards the collector K or a subsequent contaminant trap 110. The rotor 10 is provided with a shaft 15, providing the axis of rotation Q around which the rotor 10 is rotatable. In the present embodiment, the shaft 15 is rotatably held by a suitable bearing 20 of a rotor carrying structure, described below in more detail. Transmission of the radiation is schematically depicted by arrows R in FIG. 3. Desirably, a virtual extension of the rotation axis Q of the rotor 10 coincides with the radiation emission area/radiation emitting point (for example, a plasma discharge point) LEP of the source SO. A drive mechanism, for example a motor, to rotate the rotor is not specifically depicted; the skilled person will appreciate that a drive motor may be configured in various ways and be coupled to the rotor 10 in various ways.

The channel forming elements 11 may be configured in different ways, and are desirably provided by plates (e.g., foils) 11, as in FIGS. 2B, 2C (thus forming a so called foil trap). The plates 11 can be arranged in various ways. For example, FIG. 2B shows a first embodiment of a contaminant trap 10, comprising a plurality of plates 11 defining radiation transmission channels Ch. The plates 11 may be substantially solid plates 11, that do not contain apertures by themselves. The channels Ch may be arranged substantially parallel to the direction of propagation of the radiation beam during use. Further, the plates 11 are oriented substantially radially with respect to a rotation axis Q of the rotor 10, and are evenly, regularly distributed around the rotation axis Q. FIG. 2C shows an alternative embodiment, wherein the plates 11 do not extend radially from the rotation axis Q or shaft 15.

The plates 11 may be regularly and symmetrically distributed around the center axis of the trap 10, such that the channels Ch have substantially the same volume. The plates 11 can be connected to each other, for example, at radially outer sides by an outer plate connector 18, as depicted in FIG. 2C. The plates 11 may be connected directly to each other at radially inner sides and/or, for example, to the shaft 15. The rotatable contaminant trap 10 may comprise various amounts of channels Ch and respective plates 11, for example a relatively large number of relatively narrow or slit-like channels, for example at least about 100 channels, or at least about 180 channels, or only a small number of channels Ch (as in FIG. 2C).

Also, the rotor 10 may comprise electrically chargeable material and the overall configuration may be such that the rotor 10 is electrically charged as a result of the operation of the radiation source SO (see below). For example, the plates 11 and shaft 15 may be made substantially of electrical conducting material(s), for example one or more metals or alloys, for example aluminum, steel or other materials. In an embodiment, the shaft comprises a robust material, for example robust electrically conducting steel, or other material. In another embodiment, the rotor shaft comprises or consists of robust insulator material, for example ceramic insulating material, silicon carbide (SiC), or other insulator material (see below regarding FIG. 6).

Moreover, the rotor construction may be such that the channel forming elements 11 and rotor shaft 15 are electrically connected to each other, directly or indirectly, for example via suitable welded connections or in a different manner.

As follows from FIGS. 2A and 3, there may be provided a bearing 20 configured to rotatably hold the shaft 15 in a shaft receiving aperture of a rotor carrying structure 30. The bearing is shown in more detail in FIG. 3. Both the bearing 20 and rotor carrying structure 30 are only depicted schematically in the present figures, and they can have various configurations. The rotor carrying structure 30 may comprise or at least partly be made of one or more relatively strong, durable electrical conducting material.

For example, the rotor shaft bearing 20 may comprise a radial fluid bearing, such as a radial gas bearing. Radial fluid bearings as such are known from the prior art, as will be appreciated by the skilled person. In the following, the bearing will mainly be called a "gas bearing", however, this must not be construed as excluding the application of a fluid bearing.

For example, in the present embodiment, the gas bearing 20 may be configured to provide a cylindrical layer of a gas or gas mixture (or fluid or fluid mixture, in the case of a fluid bearing) that surrounds part of the shaft 15, to maintain the shaft 15 spaced-apart from an inner cylindrical surface of the rotor carrying structure 30 (the latter mentioned inner surface can also be called 'the gas bearing surface of the carrying structure', and the opposite shaft surface can be called 'the gas bearing surface of the rotor shaft', the two surfaces enclosing a space for the gas bearing). Further, the bearing 20 may also include an axial gas bearing 20a, located between a free end of the shaft 15 and an opposite inner surface of the rotor carrying structure 30. The gas bearing 20 may prevent direct contact between the shaft 15 and the rotor carrying structure 30, to provide very low friction there-between, so that the shaft 15 (and contaminant trap rotor 10) may be efficiently rotated with high speeds with respect to the carrying structure 30 (for example, speeds of over 10,000 rpm).

For example, the gas bearing 20, 20A may comprise one or more gas inlets 21 to supply the gas to the space between the shaft 15 and rotor carrying structure 30 (respective gas flows are indicated by arrows $G_B$). For example, the inlet(s) 21 may comprise a groove extending around the shaft receiving aperture of the carrying structure 30. Further, the rotor carrying structure 30 may comprise one or more gas exhausts 22 to remove gas from the space between the shaft 15 and rotor carrying structure 30 (respective gas flows are indicated by arrows). The exhaust(s) 22 may also comprise a groove extending around the shaft receiving chamber of the carrying structure 30. The bearing 20 may also be arranged and configured in various other ways, as will be appreciated by the skilled person.

During use, ratios between gas flows $G_B$ towards the gas bearing 20, via inlet(s) 21, and from the gas bearing 20, via exhaust(s) 22, may be adjusted or controlled to maintain a desired gas thickness between shaft 15 and carrying structure 30, as will be appreciated by the skilled person. As a non limiting example, the gas pressure in the gas bearing 20 may be in the range of about 0.1-5 bar during operation. In an embodiment, the gas used in the gas bearing 20 is nitrogen gas ($N_2$).

During operation of the source SO, when the source SO emits the radiation, charged debris particles (including, for example, electrons and/or ions) can be emitted by the source SO. The rotor plates 11 can capture debris, including the charged particles, emanating from the source SO, leading to electrically charging of the rotor plates 11 and shaft 15. In a non-limiting example, the contaminant trap rotor 10 and its shaft 15 may be charged to over 600 Volts, even several kV of charge, with respect to earth. Such rotor shaft charging might lead to uncontrolled abrupt electrical discharge ED (see FIG. 3) through the gas space of the gas bearing 20, between the electrically conducting shaft 15 and an electrically conducting bearing surface of the carrying structure 30, which discharge ED may damage the gas bearing surfaces and thus might hamper the operation of the contaminant trap 10.

According to an embodiment, the apparatus is configured to achieve controlling or redirecting an electrical discharge ED of the rotor 10, or suppressing an electrical discharge of the rotor 10, or both. In other words, for example, the apparatus can be configured to control electrical charge of the rotor 10. Thus, uncontrolled discharge ED may be prevented, so that a high speed rotatable contaminant trap 10 having a high reliability can be achieved. Throughout the present application, a rotor shaft discharge ED may involve electrons flowing from the shaft 15 to compensate a negatively charged shaft 15, or, vice-versa, a current of electrons flowing towards the shaft 15 to compensate a positively charged buildup.

FIGS. 3-11 show various further embodiments of the invention. One or more aspects of one or more of these embodiments may be combined with or substituted for one or more aspects of one or more other embodiments, if desired and appropriate.

Figure 4:
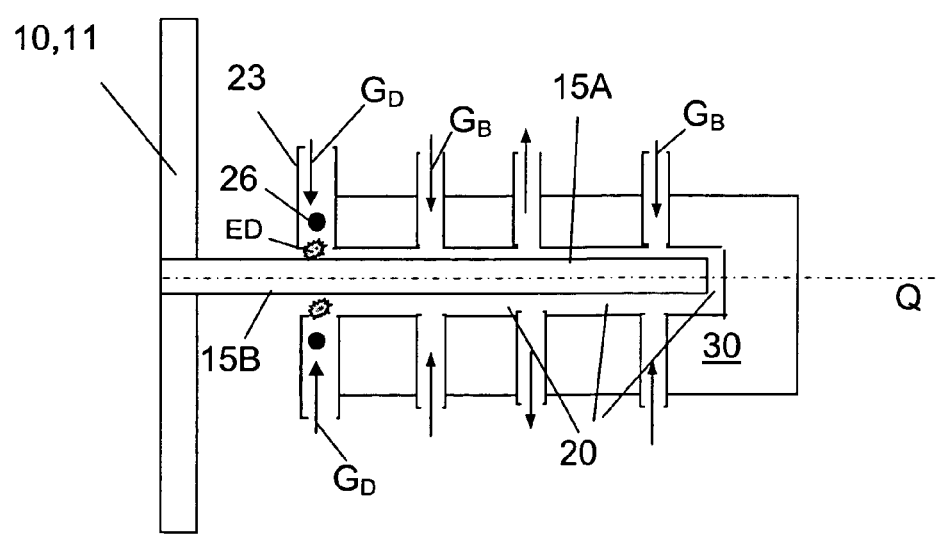
FIG. 4 is similar to FIG. 3 and depicts part of an embodiment of the invention.

In the embodiment of FIG. 4, rotor discharge is controlled or redirected by the application of a discharge stimulator structure 23. Particularly, the stimulator 23 is configured to stimulate an electrical discharge ED with the shaft 15 in an area outside the gas bearing 20. Particularly, in the present embodiment, the discharge stimulator 23 is arranged to provide that substantially all or most electrical discharge ED with the shaft 15 will occur in an area located near the rotor 10, where the gas bearing 20 is substantially not present.

For example, a first shaft part 15A is held in the gas bearing 20 and an integral second shaft part 15B reaches away from the gas bearing, is attached to the main rotor part 10 and is able to exchange charge with electrically chargeable rotor material of the rotor 10. Then, desirably, the configuration is such that compensation of a certain rotor charging (due to radiation source operation) all or mostly occurs via the second shaft part 15B or another rotor part, but not via the first shaft part 15A and gas bearing 20.

For example, in the FIG. 4 embodiment, the discharge stimulator comprises a gas supply structure 23 to supply a electrical discharge stimulating gas or gas mixture $G_D$ towards the second shaft part 15B of the shaft 15, such that at least a section of the second shaft part 15B is surrounded or otherwise contacts the discharge stimulating gas or gas mixture $G_D$. Then, in an embodiment, the discharge stimulating gas or gas mixture $G_D$ may be of a type that has a relatively low breakdown voltage, for example lower than a breakdown voltage of the bearing gas or gas mixture $G_B$ used in the gas bearing 20 during operation. The mentioned breakdown voltages will depend on gas type, gas pressure and breakdown length, and may be determined from Paschen curves (following from Paschen's Law) for various gases/gas mixtures, or by experiment or calculation. Thus, in the present embodiment, during use, the pressure of the electrical discharge stimulating gas/gas mixture $G_D$ in the area between shaft 15 and carrying structure 30 and the radial width of that area in combination with the type of gas/gas mixture $G_D$ may be such that substantially all or most rotor shaft discharge will go through that discharge stimulating gas/gas mixture $G_D$, particularly in relation to a pressure of the bearing gas/gas mixture $G_B$, the radial width of the gas bearing in combination with the type of bearing gas/gas mixture $G_B$.

In this way, electrical discharge via the first shaft part 15A may be prevented, since it is much more likely that electrical breakdown ED (or breakthrough) will occur at the second shaft part 15B due to the application of the described discharge stimulating gas or gas mixture $G_D$. Thus, for example, electrical discharge ED will be guided by that discharge stimulating gas/gas mixture $G_D$ between shaft 15 and, for example, a part of the carrying structure 30, so that damage to the bearing part 20 can be prevented.

As a non limiting example, in the case that the gas used in the gas bearing is nitrogen, the discharge stimulation gas may be argon. The skilled person will appreciate that various gases or gas mixtures may be suitable to provide the electrical discharge stimulation at the second rotor shaft part 15B, for example using and comparing the commonly known Paschen curves for the gases/gas mixtures in relation to the shaft/bearing configuration.

In a further embodiment, the gas supply 23 may include a cylindrical groove in the carrying structure 30, around the second shaft portion 15B, to receive the discharge stimulating gas/gas mixture $G_D$. Moreover, in an embodiment, there may be provided an electrode 26 in or near a downstream part of the gas supply 23, to further stimulate electrical discharge through the discharge stimulating gas/gas mixture $G_D$. To this end, the electrode 26 may be connected to a potential source to apply a suitable electrical potential to the electrode in order to redirect rotor shaft electrical discharge via the electrode 26. Thus, the discharge stimulator structure may comprise an electrode 26, for example a ring-shaped electrode, extending or reaching to a location near an outer surface of the second shaft part 15B, the electrode desirably being connected to a potential source, or a suitable charge drain (e.g., earth). For example, a well controlled glow discharge may be achieved between the shaft 15 and the electrode 26, thus preventing damage to the shaft 15 and gas bearing 20. For example, a continuous electrically conductive path may be formed which can guide the charge from the shaft 15 to ground even before an uncontrolled discharge occurs, thus preventing material transport, and thus giving an increased lifetime to gas bearing surfaces. The electrode 26 can have various configurations and shapes. For example, the electrode 26 may comprise field enhancing sharp edges or a sharp tip, to enhance the redirection of the electrical discharge ED towards the electrode.

Figure 5:
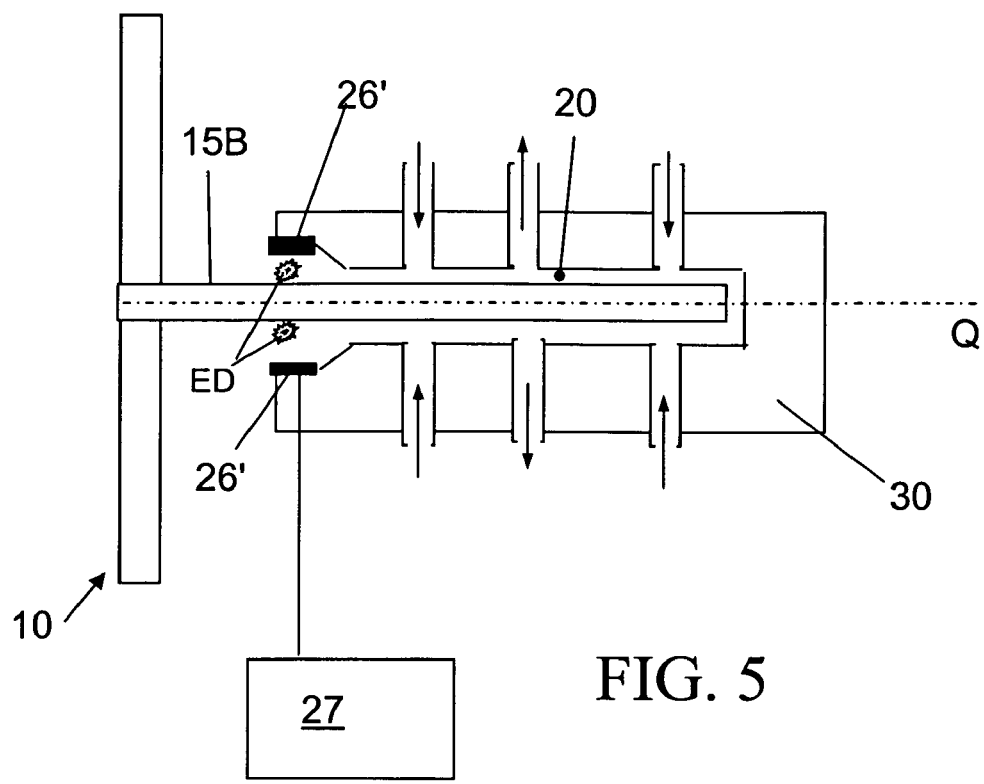
FIG. 5 is similar to FIG. 3 and depicts part of another embodiment of the invention.

FIG. 5 depicts another embodiment, which is similar to the embodiment of FIG. 4, but does not comprise a gas supply configured to supply electrical discharge stimulating gas. In the FIG. 5 embodiment, there is provided an electrically conductive electrode 26', extending or reaching to a location near an outer surface of the second shaft part 15B, the electrode being connected to a potential source 27. The electrode 26' is located in an area which does not form part of the bearing 20, for example at a locally widened part of the rotor shaft aperture of the carrying structure 30. The electrode 26' may be charged by the potential source 27 to a desired high voltage (for example a high positive voltage in case the shaft 15 is expected to be negatively charged during use) to redirect shaft discharge away from the gas bearing 20.

Figure 6:
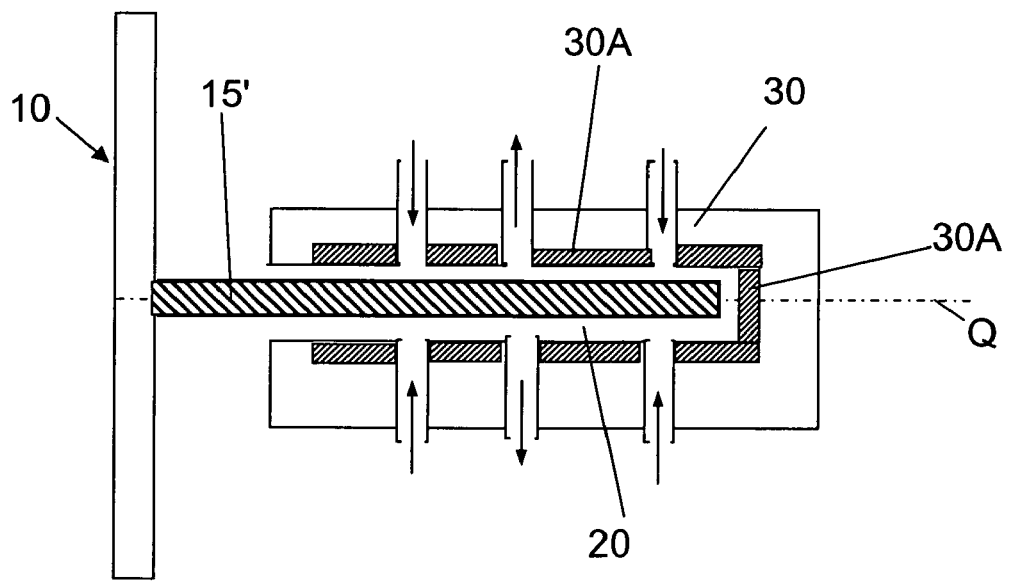
FIG. 6 is similar to FIG. 3 and depicts part of another embodiment of the invention.

FIG. 6 shows another embodiment. In this case, the rotor 10 is electrically isolated from the rotor carrying structure 30, such that the rotor cannot discharge via the gas bearing 20. For example, to that aim, the rotor shaft 15' can be made of electrically insulating material, for example electrically insulating ceramic material(s). Also, or alternatively, to that aim, one or more parts 30A of the carrying structure that surrounds the gas bearing 20 can be made of electrically insulating material, for example electrically insulating ceramic material(s). In FIG. 6, electrically insulating materials 15', 30A are shown as hatched.

Figure 7:
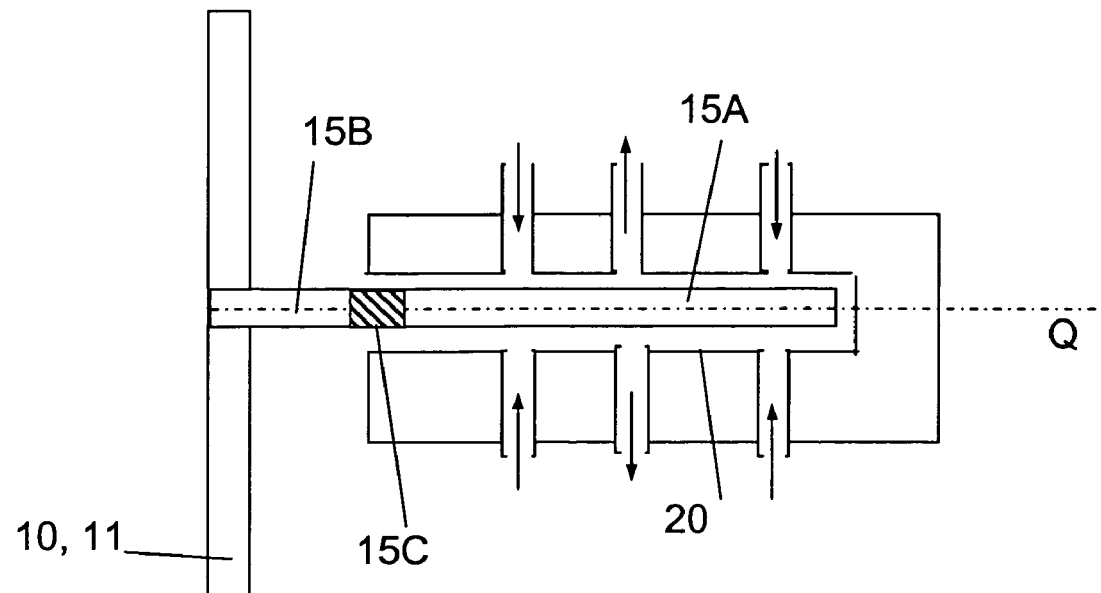
FIG. 7 is similar to FIG. 3 and depicts part of another embodiment of the invention.
Figure 8:
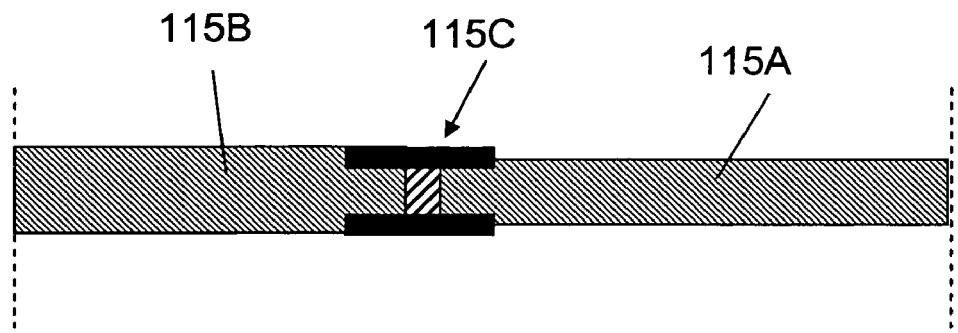
FIG. 8 shows a detail of another embodiment of FIG. 7.

FIGS. 7 and 8 show another embodiment. In this case, only a part of the rotor shaft 15 comprises electrically insulating material to prevent flow of electrical charge, via the gas space of the gas bearing, between the rotor 10 and the gas bearing surface of the rotor carrying structure 30. For example, the shaft 15 can comprise a shaft section 15C which is substantially located outside the gas bearing 20, which shaft section is made of electrically insulating material. FIG. 8 shows a detail of a shaft 15, wherein a first shaft part 115A and a second shaft part 115B are spaced-apart from each other, and are integrally attached to each other by an electrically insulating coupling part 115C. The coupling part 115C is made of one or more insulating materials and ensures that no or little electrical current can flow between the two shaft parts 115A, 115B during operation of the apparatus. For example, suitable materials may include oxides, aluminum oxide, silicon carbide, ceramic material, combinations of such materials, and other materials as will be appreciated by the skilled person.

Figure 9:
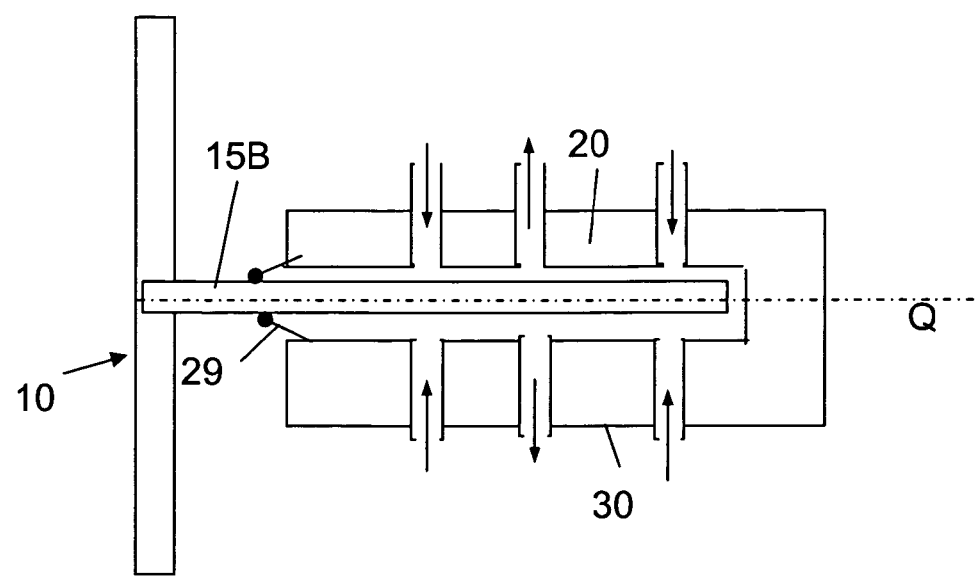
FIG. 9 is similar to FIG. 3 and depicts part of another embodiment of the invention.

FIG. 9 depicts another embodiment. In this case, electrical discharge of the rotor 10 (particularly the shaft 15) is controlled by one or more electrically conductive couplings 29 in electrical contact with an electrically conductive outer surface of the shaft 15 on one hand and with an electrically conductive part of the rotor carrying structure, a charge drain, or both, on the other hand. For example, the charge drain may include earth, or be another suitable charge receiving/collecting structure.

In the FIG. 9 embodiment, a number of sliding contacts 29 bridge the gas space of gas bearing 20 to provide the described conductive coupling. In an embodiment, the sliding contacts 29 are attached to the rotor carrying structure 30 and are in sliding contact with an outer surface of the shaft 15, to provide paths for charge exchange between shaft 15 and carrying structure 30. Alternatively or additionally, for the same aim, sliding contacts may be integrally connected to the shaft 15 and be in sliding contact with a part of the rotor carrying structure 30. In an embodiment, the sliding contacts may comprise electrically conducting hairs or wires, for example made of a suitable metal or alloy.

Figure 10:
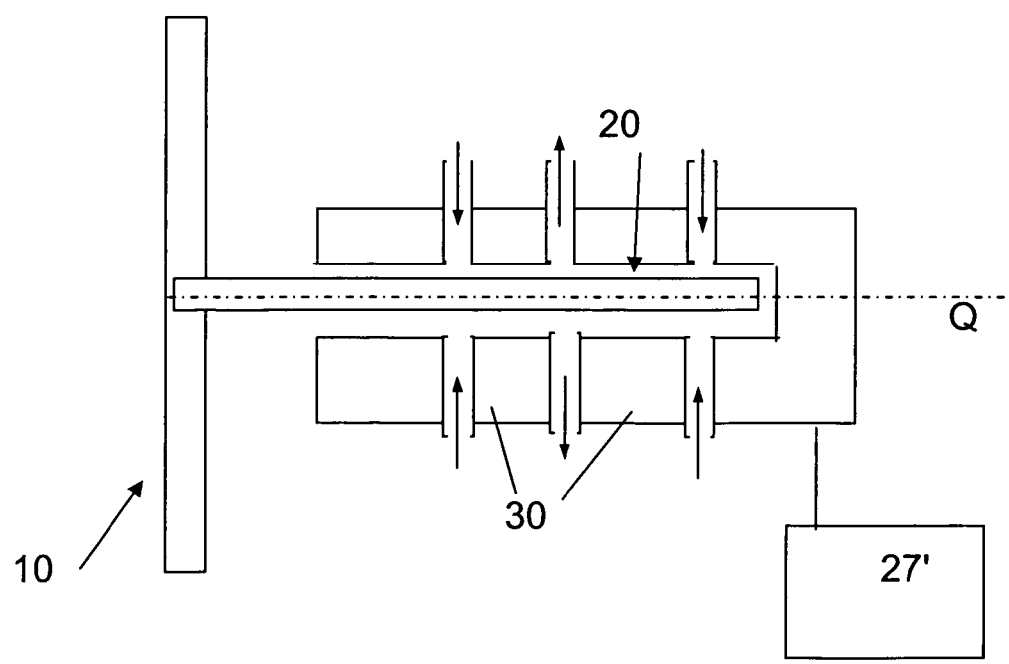
FIG. 10 is similar to FIG. 3 and depicts part of another embodiment of the invention.

FIG. 10 depicts an embodiment wherein electrical discharge of the shaft is substantially prevented or lessened utilizing a potential source 27' to charge the rotor carrying structure 30 to a suitable discharge-counteracting voltage (in FIG. 10, the gas bearing inlets and exhausts appear to divide the rotor carrying structure in separate parts, however, in practice, this will not be the case, so that the potential source 27' can charge at least all gas bearing surfaces of the rotor carrying structure 30). For example, in the case that it is expected that the shaft 15 may be charged to a certain positive voltage (for example to a potential V1=+500V), the rotor carrying structure 30 may also be charged to a positive voltage (for example to a potential V2=+400V) to counteract any abrupt electrical discharge of the shaft 15 via the gas space of the gas bearing 20. Herein, the rotor carrying structure 30 may be charged simply to a voltage V2, such the difference between that voltage V2 and the expected voltage of the rotor shaft V1 remains below a certain breakdown voltage for the gas bearing 20. In an embodiment, the operation of the potential source 27' may be associated with the operation of the radiation source SO, for example via a suitable controller, to charge the rotor carrying structure 30 only in the case of, or depending on, activation of the radiation source SO.

Figure 3:
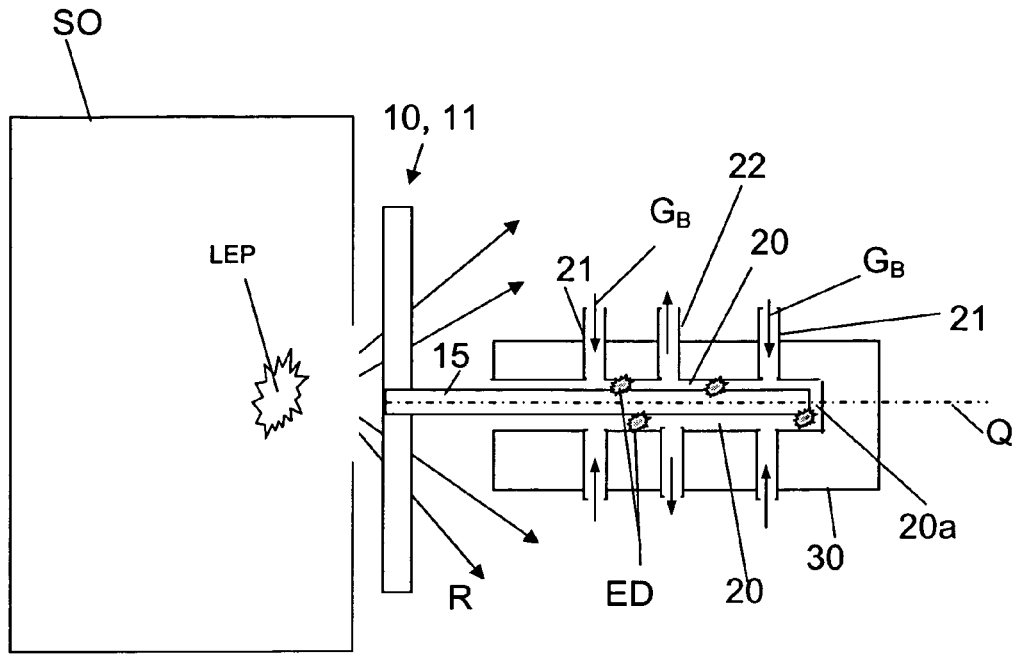
FIG. 3 schematically depicts part of the embodiment of FIG. 1, wherein a fluid bearing of the contaminant trap is shown in more detail.

In an embodiment, which is not specifically depicted in FIG. 9, the bearing 20 is a radial fluid bearing, configured to provide gas to a space between a part of a shaft 15 and part of the rotor carrying structure 30 (as in FIGS. 2 and 3). Then, it is also advantageous if the fluid bearing is configured to provide an electrically conducting fluid or fluid mixture to provide an electrical conducting path between the rotor shaft and the rotor carrying structure, to gradually even out any electrical potential differences therebetween. For example, the fluid provided by the fluid bearing 20 may at least partly comprise or consist of ions, or ionized bearing gas. In this way, a glow discharge may be generated instead of abrupt sparks, between shaft 15 and rotor carrying structure 30, wherein the overall fluid bearing 20 as such may provide the discharge path to discharge the rotor 10 in a controlled manner.

In an embodiment, the fluid bearing 20 may be a liquid bearing, configured to provide a good electrically conducting liquid (at room temperature), for example a liquid metal or liquid alloy, for example tin, or an alloy comprising one or more of tin, indium and gallium (for example one of the alloys: gallium-indium and tin-gallium-indium). In that case, a controlled discharge of the shaft 15 may simply evolve through the liquid of the bearing 20, without leading to damage of the bearing surfaces of shaft 15 and the surrounding structure 30.

Vice-versa, the fluid bearing 20 may be selected to form a very good electrical isolation between the shaft 15 and the carrying structure 30 to substantially prevent or lessen any electrical discharge through the bearing 20 during the operation of the apparatus.

An embodiment of the present invention is relatively easy and cheap to implement. Also, in one or more embodiments, there is no mechanical contact with the high speed rotor 10 and its shaft 15, in which case there will be no additional wear, nor will extra motor power be required. The charge buildup on the shaft 15 may be very rapid (<100 ns), and due to the skin effect, it is expected that electric current is forced to flow mostly at the outer surface of the shaft 15. Considering this effect, the above-described embodiments may take out the electrons just where they are forced to flow, i.e., from the outer shaft surface.

One or more embodiments of the invention may include, for example, making electrical contact to the shaft 15 with a brush ring. Additionally or alternatively, the total mechanics (including the rotor 10 and the rotor carrying structure 30) may be electrically isolated with respect to an environment thereof, to suppress uncontrolled rotor shaft discharge, wherein a good capacitive coupling might be relied upon between shaft 15 and housing 30 to reduce the differential voltage. In an embodiment, the channel forming elements 11 may be electrically isolated from its shaft 15 (similar to the embodiments depicted in FIGS. 6-8).

In another embodiment, there may be provided an electrically conducting bearing 20 configured to rotatably hold (i.e. carry, guide or support) the rotor 10 or shaft 15 with respect to a rotor carrying structure 30. For example, the electrically conducting bearing 20 may be an above-described radial gas bearing 20, utilizing an electrically conducting gas or gas mixture. In an embodiment, the bearing 20 may be an electrically conducting ball bearing, particularly an electrically conducting radial ball bearing. In the latter case, for example, one or more balls of the ball bearing may be made of electrically conducting material. Also, the ball bearing embodiment may be combined with one or more embodiments described above and shown in the Figures.

Figure 11:
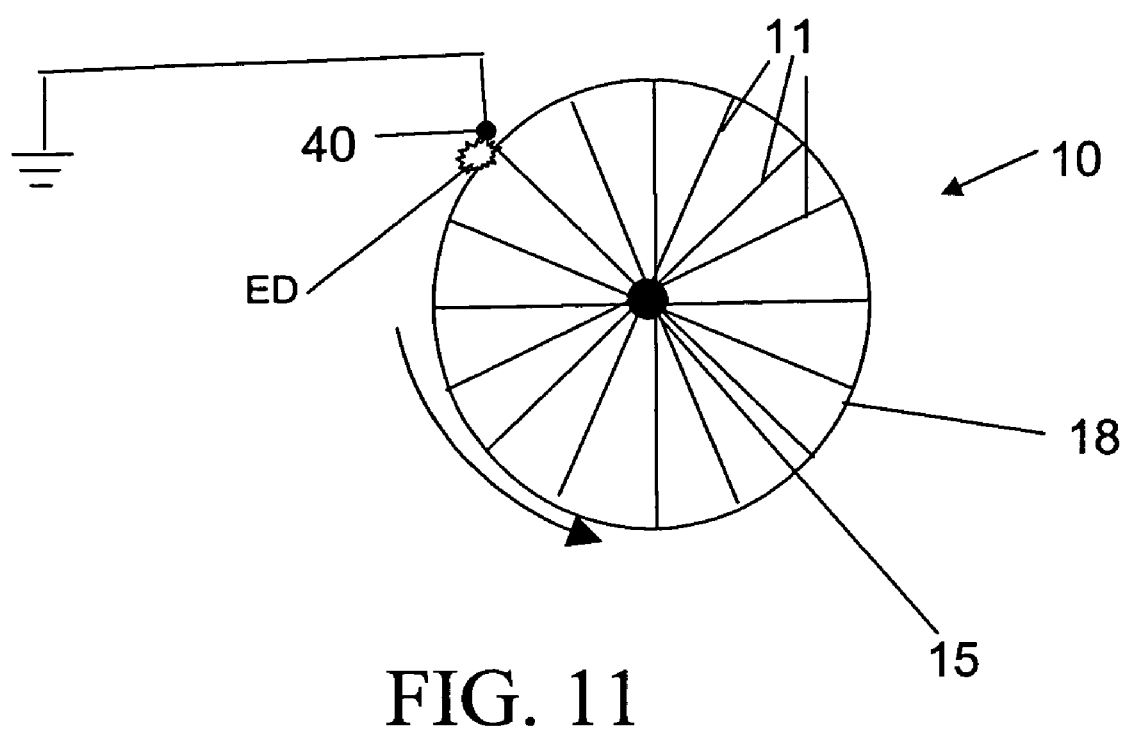
FIG. 11 is similar to FIG. 2B and depicts part of another embodiment of the invention.

FIG. 11 shows another embodiment. In this case, there is provided a rotor discharge stimulator 40 near or in electrical contact with part of the rotor 10 as such. For example, the rotor discharge stimulator 40 may comprise an electrode or sliding contact 40, arranged to discharge the rotor via an outer rotor part 18 (which can be, for example, a circular outer rotor part that interconnects the channel forming elements 11 with each other). The rotor discharge stimulator 40 may make direct electrical contact with the outer rotor part 18, or be located on a suitable short distance from the rotor, to receive charge from the rotor 10 during operation. Further, the rotor discharge stimulator 40 may be coupled electrically to ground, to a charge drain or a potential source, to conduct charge away from the rotor 10. In the case of an electrode 40 as the discharge stimulator, again, the electrode 40 may comprise field enhancing sharp edges or a sharp tip, to enhance the redirection of the electrical discharge ED towards the electrode.

One or more of the above described embodiments may provide various advantages. For example, one or more of the embodiments of the rotatable contaminant trap may achieve long operational periods and/or may provide an effective capturing of debris emanating from the radiation source, without requiring much maintenance.

The present apparatus configuration having a rotatable contaminant trap may relate to a lithographic apparatus, but is not specifically limited thereto, since one or more embodiments of the invention may also be applied outside the field of lithography.

Although specific reference may be made in this text to the use of lithographic apparatus in the manufacture of ICs, it should be understood that the lithographic apparatus and/or collector described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 248, 193, 157 or 126 nm) and extreme ultra-violet (EUV) radiation (e.g. having a wavelength in the range of 5-20 nm), as well as particle beams, such as ion beams or electron beams. Particularly, the radiation is of a type that can generate plasma in a low pressure (vacuum) environment.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

The invention claimed is:

1. A contaminant trap apparatus arranged in a path of a radiation beam to trap contaminants emanating from a radiation source configured to produce the radiation beam, the contaminant trap apparatus comprising:

a rotor having a plurality of channel forming elements defining channels which are arranged substantially parallel to the direction of propagation of the radiation beam, the rotor comprising electrically chargeable material and arranged to be electrically charged as a result of the operation of the radiation source; and a bearing configured to rotatably hold the rotor with respect to a rotor carrying structure, wherein the apparatus is configured to (i) control or redirect an electrical discharge of the rotor, or (ii) suppress an electrical discharge of the rotor, or (iii) both (i) and (ii).

2. The apparatus according to claim 1, wherein electrical discharge of the rotor is controlled by an electrically conductive coupling, which is in electrical contact with an electrically conductive part of the rotor and with an electrically conductive part of the rotor carrying structure, a charge drain, or both.

3. The apparatus according to claim 2, wherein the electrical coupling comprises a sliding contact.

4. The apparatus according to claim 1, wherein the bearing comprises a radial gas bearing structure, provided between a rotor shaft and part of the rotor carrying structure, wherein the rotor shaft comprises electrically insulating material to prevent flow of electrical charge, at the gas bearing structure, between the rotor and a bearing surface of the rotor carrying structure.

5. The apparatus according to claim 1, wherein the bearing comprises a radial gas bearing structure, provided between a first part of a rotor shaft and part of the rotor carrying structure, wherein the gas bearing structure is configured to supply a gas or gas mixture to between the first part of the rotor shaft and the rotor carrying structure, and wherein (i) a discharge stimulating structure is provided, or (ii) a discharge stimulating gas or gas mixture is configured to be provided, or (iii) both (i) and (ii), at or near a different second part of the rotor shaft to stimulate an electrical discharge with the rotor shaft in an area outside the gas bearing structure, the second shaft part being attached to the rotor and being able to exchange charge with the electrically chargeable rotor material.

6. The apparatus according to claim 5, wherein the second shaft part is not substantially surrounded by the gas bearing structure and extends between the rotor and the first shaft part.

7. The apparatus according to claim 5, wherein the discharge stimulating gas or gas mixture has a lower breakdown voltage than the bearing gas or gas mixture.

8. The apparatus according to claim 5, wherein the discharge stimulating structure comprises an electrically conductive electrode, extending or reaching to a location near an outer surface of the second shaft part, the electrode being connected to a charge drain or a potential source.

9. The apparatus according to claim 1, wherein the bearing comprises a radial fluid bearing structure, provided between a part of a rotor shaft and part of the rotor carrying structure, wherein the fluid bearing structure is configured to supply an electrically conducting fluid or fluid mixture to provide an electrical conducting path between the rotor shaft and the rotor carrying structure.

10. The apparatus according to claim 1, wherein the bearing comprises a radial gas bearing structure, and the channel forming elements comprise plates defining the channels, the plates arranged substantially parallel to the direction of propagation of the radiation beam, wherein part of a rotor shaft reaches into the gas bearing structure.

11. The apparatus according to claim 1, further comprising a radiation system including the radiation source.

12. A lithographic apparatus, comprising:
a contaminant trap apparatus arranged in a path of a radiation beam to trap contaminants emanating from a radiation source configured to produce the radiation beam, the contaminant trap apparatus comprising:
a rotor having a plurality of channel forming elements defining channels which are arranged substantially parallel to the direction of propagation of the radiation beam, the rotor comprising electrically chargeable material and arranged to be electrically charged as a result of the operation of the radiation source; and
a bearing configured to rotatably hold the rotor with respect to a rotor carrying structure,
wherein the contaminant trap apparatus is configured to (i) control or redirect an electrical discharge of the rotor, or (ii) suppress an electrical discharge of the rotor, or (iii) both (i) and (ii);
a substrate table configured to hold a substrate; and
a projection system configured to project the radiation beam as patterned onto the substrate.

13. The lithographic apparatus according to claim 12, wherein electrical discharge of the rotor is controlled by an electrically conductive coupling, which is in electrical contact with an electrically conductive part of the rotor and with an electrically conductive part of the rotor carrying structure, a charge drain, or both.

14. The lithographic apparatus according to claim 12, wherein the bearing comprises a radial gas bearing structure, provided between a rotor shaft and part of the rotor carrying structure, wherein the rotor shaft comprises electrically insulating material to prevent flow of electrical charge, at the gas bearing structure, between the rotor and a bearing surface of the rotor carrying structure.

15. The lithographic apparatus according to claim 12, wherein the bearing comprises a radial gas bearing structure, provided between a first part of a rotor shaft and part of the rotor carrying structure, wherein the gas bearing structure is configured to supply a gas or gas mixture to between the first part of the rotor shaft and the rotor carrying structure, and wherein (i) a discharge stimulating structure is provided, or (ii) a discharge stimulating gas or gas mixture is configured to be provided, or (iii) both (i) and (ii), at or near a different second part of the rotor shaft to stimulate an electrical discharge with the rotor shaft in an area outside the gas bearing structure, the second shaft part being attached to the rotor and being able to exchange charge with the electrically chargeable rotor material.

16. The lithographic apparatus according to claim 15, wherein the second shaft part is not substantially surrounded by the gas bearing structure and extends between the rotor and the first shaft part.

17. The lithographic apparatus according to claim 15, wherein the discharge stimulating gas or gas mixture has a lower breakdown voltage than the bearing gas or gas mixture.

18. The lithographic apparatus according to claim 15, wherein the discharge stimulating structure comprises an electrically conductive electrode, extending or reaching to a location near an outer surface of the second shaft part, the electrode being connected to a charge drain or a potential source.

19. The lithographic apparatus according to claim 12, wherein the bearing comprises a radial fluid bearing structure, provided between a part of a rotor shaft and part of the rotor carrying structure, wherein the fluid bearing structure is configured to supply an electrically conducting fluid or fluid mixture to provide an electrical conducting path between the rotor shaft and the rotor carrying structure.

20. The lithographic apparatus according to claim 12, wherein the bearing comprises a radial gas bearing structure, and the channel forming elements comprise plates defining the channels, the plates arranged substantially parallel to the direction of propagation of the radiation beam, wherein part of a rotor shaft reaches into the gas bearing structure.

* * * * *